United States Patent
Bong et al.

(10) Patent No.: US 7,271,399 B2
(45) Date of Patent: Sep. 18, 2007

(54) MANIPULATOR ASSEMBLY IN ION IMPLANTER

(75) Inventors: Sung-Jong Bong, Gyeonggi-do (KR); Hong-Kuk Eom, Gyeonggi-do (KR); Doo-Sang You, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 342 days.

(21) Appl. No.: 11/025,595

(22) Filed: Dec. 28, 2004

(65) Prior Publication Data

US 2005/0151089 A1    Jul. 14, 2005

(30) Foreign Application Priority Data

Dec. 30, 2003   (KR)   .............. 10-2003-0100495

(51) Int. Cl.
*H01J 37/317*   (2006.01)
(52) U.S. Cl. ................ 250/492.21; 250/396 R; 250/492.2; 250/398; 250/492.3
(58) Field of Classification Search .......... 250/492.21, 250/396 R, 492.2, 492.3
See application file for complete search history.

(56) References Cited

U.S. PATENT DOCUMENTS

| | | | | |
|---|---|---|---|---|
| 5,399,871 A | * | 3/1995 | Ito et al. ................ | 250/492.21 |
| 5,932,882 A | * | 8/1999 | England et al. ......... | 250/492.21 |
| 5,959,396 A | * | 9/1999 | Moreshead et al. ...... | 313/363.1 |
| 6,060,715 A | * | 5/2000 | England et al. ......... | 250/492.21 |
| 6,291,827 B1 | * | 9/2001 | Tsai et al. .............. | 250/492.21 |
| 6,501,078 B1 | * | 12/2002 | Ryding et al. .......... | 250/423 R |
| 6,534,775 B1 | * | 3/2003 | Harrington et al. ..... | 250/492.21 |

* cited by examiner

*Primary Examiner*—Jack I. Berman
*Assistant Examiner*—Michael J Logie
(74) *Attorney, Agent, or Firm*—Marger Johnson & McCollom, P.C.

(57) ABSTRACT

A manipulator assembly in an ion implanter comprises a ground electrode, a first suppression electrode located on a first side of the ground electrode facing an ion source device for producing ion beams, a second suppression electrode which is located on a second side of the ground electrode opposite to the first side, connection legs which electrically connect and mechanically support the first and second suppression electrodes; and an insulator which is located between the ground electrode and the second suppression electrode to insulate the ground electrode from the first and second suppression electrodes.

22 Claims, 5 Drawing Sheets

MANIPULATOR ASSEMBLY IN ION IMPLANTER

BACKGROUND OF THE INVENTION

This application claims the priority of Korean Patent Application No. 2003-100495, filed on Dec. 30, 2003, in the Korean Intellectual Property Office, the disclosure of which is incorporated herein in its entirety by reference.

1. Field of the Invention

The present invention relates to an ion implanter used for manufacturing a semiconductor device, and more particularly, to a manipulator assembly in an ion implanter.

2. Description of the Related Art

An ion implanter is used to dope semiconductor wafers with impurities in the manufacture of a semiconductor device. The ion implanter includes an ion source portion which produces ion beams with which the semiconductor wafer is to be doped, and a manipulator assembly which focuses the ion beams. The ion beams pass through the manipulator assembly, undergo various filtering processes, and are implanted into the semiconductor wafer.

FIG. 1 is a schematic view for illustrating an ion source portion, and a manipulator assembly in an ion implanter, according to the prior art, and FIG. 2 is a perspective view of the manipulator assembly in the ion implanter of FIG. 1.

Referring to FIGS. 1 and 2, the ion implanter includes an ion source portion 100 which produces ion beams IB, and a manipulator assembly 200 which is adjacent to the ion source portion 100, and focuses the ion beams IB.

The ion source portion 100 includes an arc chamber 102 which arc-discharges a supplied source gas to produce the ion beams IB. The ion beams IB are discharged through a first hole 104 which is provided on a side of the arc chamber 102.

The manipulator assembly 200 includes a ground electrode 202. First and second suppression electrodes 204 and 206 are positioned at predetermined distances from the left and right sides of the ground electrode 202, respectively. The first and second suppression electrodes 204 and 206 are electrically interconnected and supported by connection legs 208. The first suppression electrode 204 keeps a distance L1 from the ground electrode 202, and the second suppression electrode 206 keeps a distance L2 from the ground electrode 202. The distance L2 is longer than the distance L1.

Insulators 210 are positioned between the first suppression electrode 204 and the ground electrode 202. A voltage difference between the first and second suppression electrodes 204 and 206 and the ground electrode 202 is kept at about 5 kV during implantation of the ion beams IB. A ground shield 212 is attached to a side of the ground electrode 202 so that the ion beams IB are not adhered onto the ground electrode 202.

The ion beams IB are supplied to a second hole 214 made in the first suppression electrode 204 of the manipulator assembly 200 via the first hole 104 of the arc chamber 102. The ion beams IB are controlled, focused, and discharged via a third hole 216 made in the ground electrode 202 and a fourth hole 218 made in the ground shield 212.

FIG. 3 is a graph for showing variations in a suppression current with respect to the time required for using the ion implanter of FIGS. 1 and 2.

As described above, the manipulator assembly 200 in the ion implanter of FIGS. 1 and 2 insulates the first suppression electrode 204 from the second suppression electrode 206 using the insulators 210. Also, the voltage difference between the first suppression electrode 204 and the ground electrode 202 is kept at about 5 kV. However, as impurities are implanted into a plurality of portions of a semiconductor wafer using the ion implanter, i.e., the ion implanter is used for a long period of time, the ion beams IB are deposited on the insulators 210. This leads to a reduction in a resistance of the insulators 210, which results in increasing the suppression current as marked with ◇. Thus, the manipulator assembly 200 must be periodically overhauled to overcome this problem.

SUMMARY OF THE INVENTION

The present invention provides a manipulator assembly in an ion implanter capable of preventing ion beams from being depositing on insulators between a suppression electrode and a ground electrode so as to prevent a suppression current from increasing.

According to an aspect of the present invention, there is provided a manipulator assembly in an ion implanter, including a ground electrode; a first suppression electrode located on a first side of the ground electrode facing an ion source device which produces ion beams; a second suppression electrode which is located on a second side of the ground electrode opposite to the first side; connection legs which electrically connect and mechanically support the first and second suppression electrodes; and an insulator which is located between the ground electrode and the second suppression electrode to insulate the ground electrode from the first and second suppression electrodes.

The manipulator assembly in the ion implanter may further include a ground shield which is installed to face the second suppression electrode so as to prevent the ion beams from being deposited on a side of the ground electrode. A distance between the ground electrode and the second suppression electrode may be longer than a distance between the ground electrode and the first suppression electrode.

According to another aspect of the present invention, there is provided a manipulator assembly in an in implanter, including: a ground electrode; a first suppression electrode which is installed in front of the ground electrode to face a source part which produces ion beams; a second suppression electrode which is installed in the rear of the ground electrode; connection legs which electrically connect and mechanically support the first and second suppression electrodes; insulators which are installed between the ground electrode and the second suppression electrode to insulate the ground electrode from the first and second suppression electrodes; and first and second cup shields which are installed to prevent the ion beams from being deposited around the insulators.

The first cup shield may be installed on the ground electrode, and the second cup shield may be installed on the second suppression electrode. The manipulator assembly in the ion implanter may further include a ground shield which is installed to face the second suppression electrode so as to prevent the ion beams from being deposited on a side of the ground electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
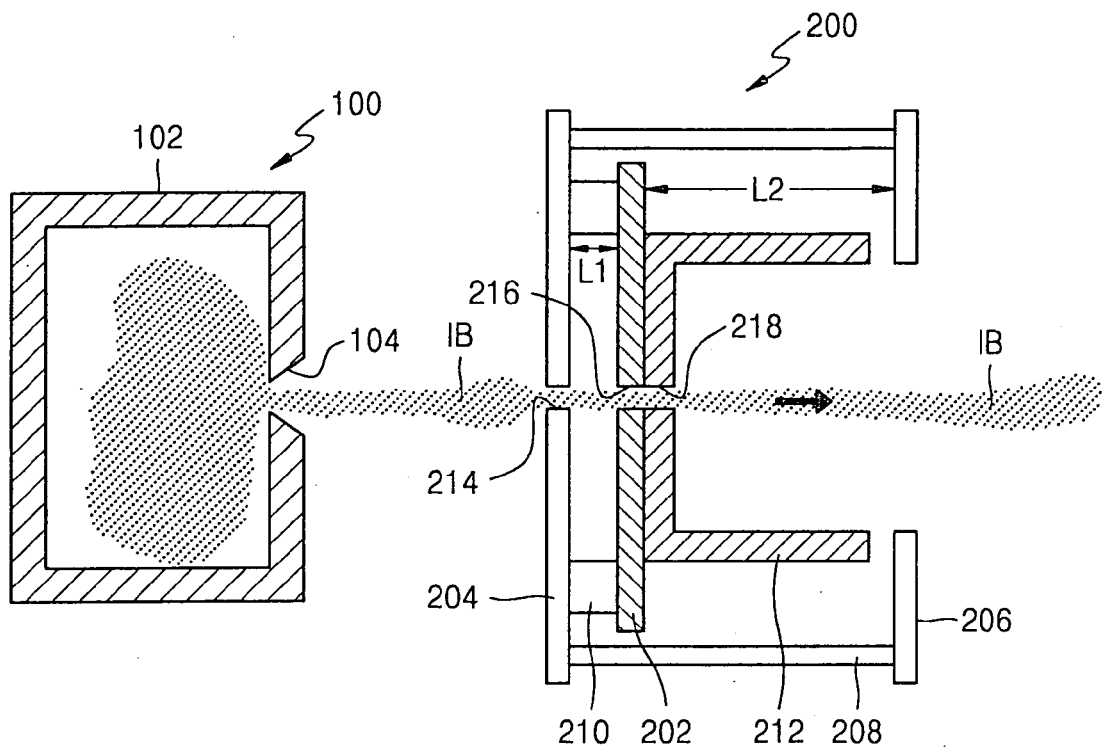
FIG. 1 is a schematic view for explaining an ion implantor, and a manipulator assembly in the ion implanter, according to the prior art.
Figure 2:
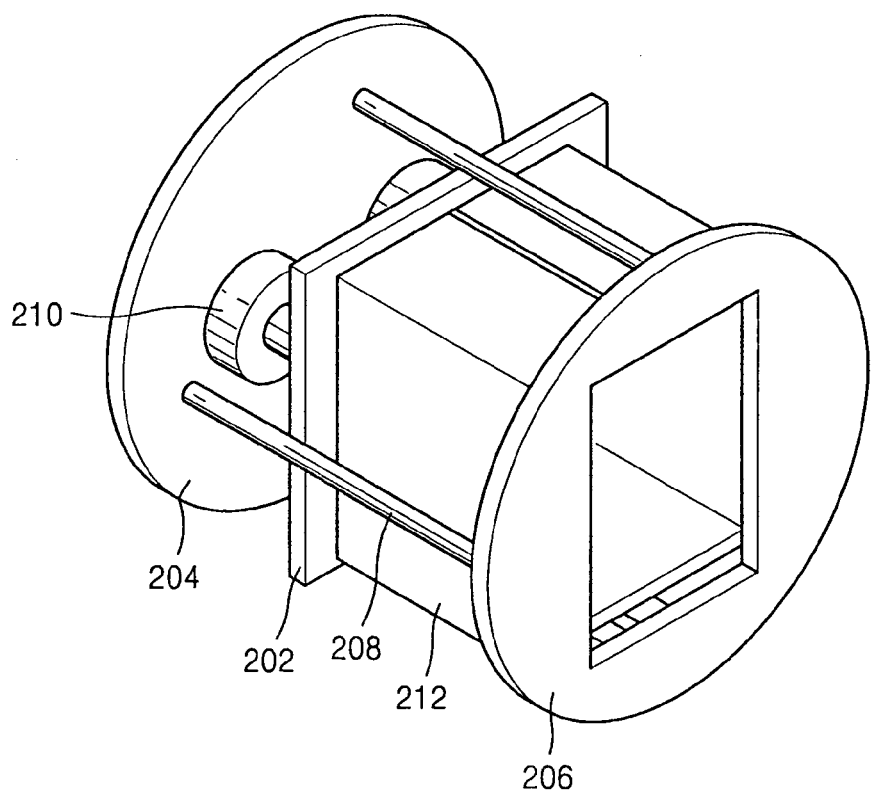
FIG. 2 is a perspective view of the manipulator assembly in the ion implanter of FIG. 1.
Figure 3:
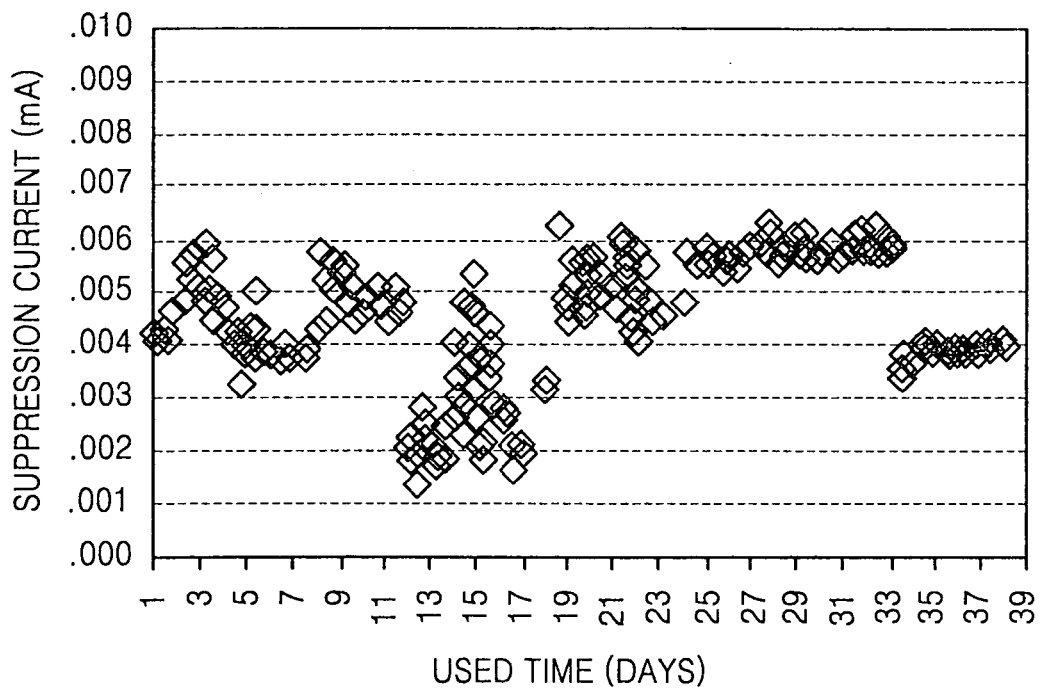
FIG. 3 is a graph for showing variations in a suppression current with respect to the time required for using the ion implanter of FIGS. 1 and 2.
Figure 4:
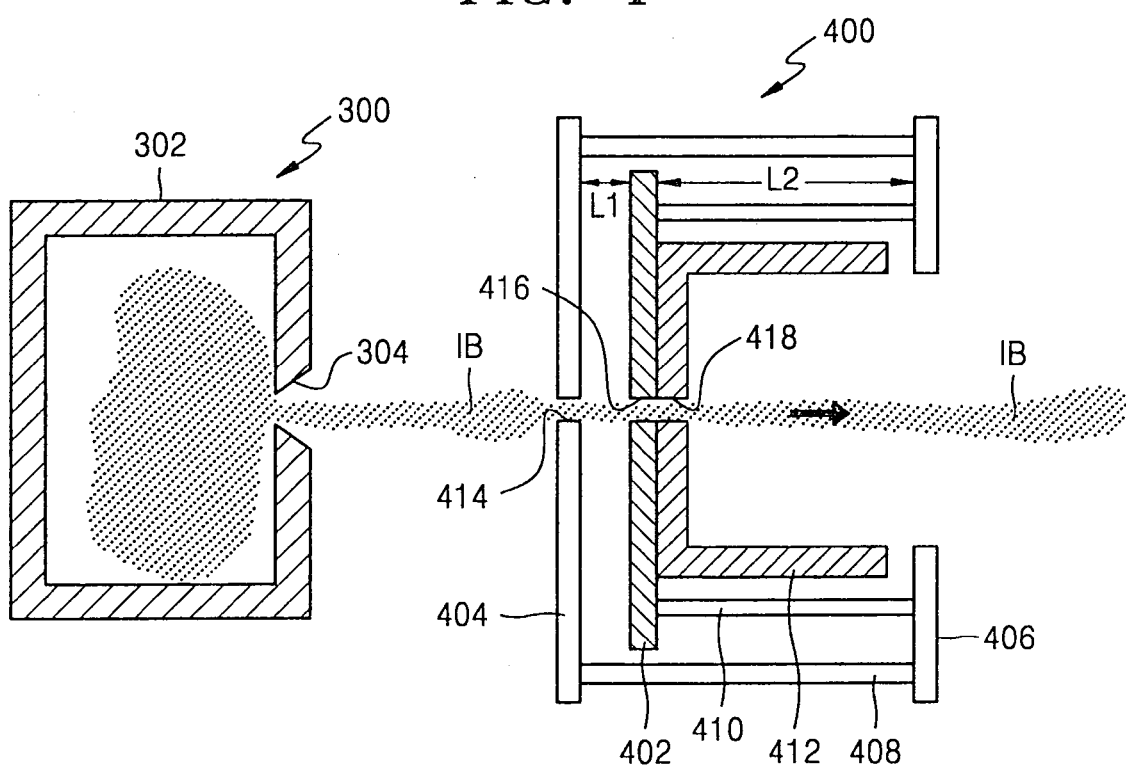
FIG. 4 is a schematic view of a source part and a manipulator assembly in an ion implanter, according to an embodiment of the present invention.
Figure 5:
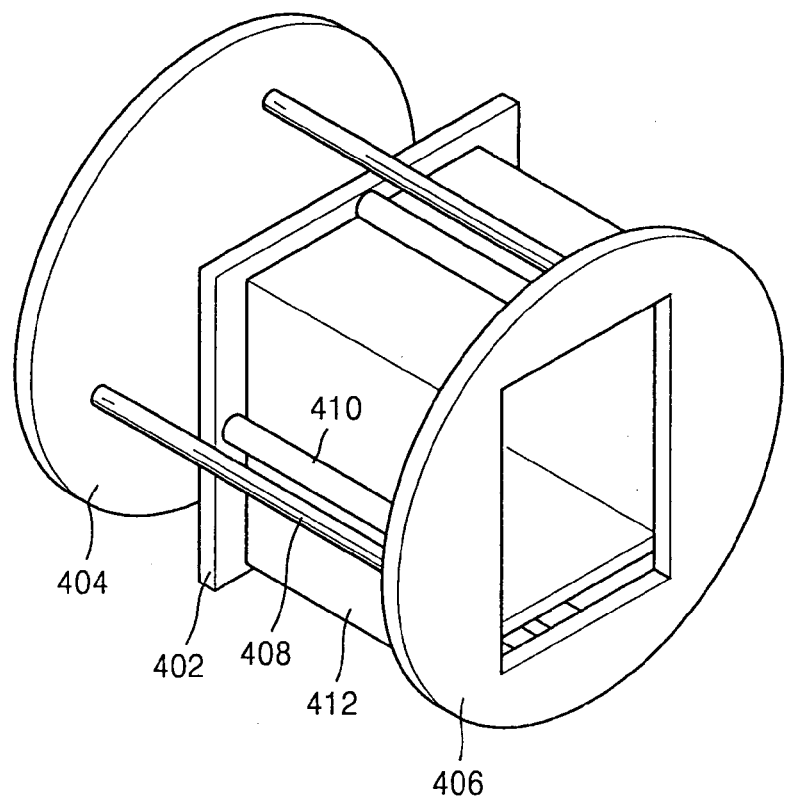
FIG. 5 is a perspective view of the manipulator assembly in the ion implanter of FIG. 4.

Referring to FIGS. 4 and 5, the ion implanter includes an ion source device 300 which produces ion beams IB, and a manipulator assembly 400 which is adjacent to the ion source device 300 and focuses the ion beams IB.

The ion source device 300 includes an arc chamber 302 which discharges a supplied source gas to produce the ion beams IB. The ion beams IB are discharged via a first hole 304 which is provided on a side of the arc chamber 302.

The manipulator assembly 400 includes a ground electrode 402. The ground electrode 402 is formed of graphite or the like. First and second suppression electrodes 404 and 406 are positioned at predetermined distances from the left and right sides of the ground electrode 402. In other words, the first suppression electrode 404 is positioned in front of the ground electrode 402 so as to face the ion source device 300 which produces the ion beams IB. The second suppression electrode 406 is positioned in the rear of the ground electrode 402.

The first and second suppression electrodes 404 and 406 are electrically interconnected and supported by connection legs 408. A distance L1 between the ground electrode 402 and the first suppression electrode 404 and a distance L2 between the ground electrode 402 and the second suppression electrode 406 are kept as in the manipulator assembly according to the prior art.

Unlike the manipulator assembly of the prior art, in the manipulator assembly according to the present invention, insulators 410 are positioned between the second suppression electrode 406 and the ground electrode 402. A voltage difference between the first and second suppression electrodes 404 and 406 and the ground electrode 402 is kept at about 5 kV during implantation of the ion beams IB. In other words, a −5 kV voltage is applied to the first and second suppression electrodes 404 and 406 and the ground electrode 402 is ground to maintain a voltage difference therebetween.

A ground shield 412 is attached to a side of the ground electrode 402 so as not to stick the ion beams IB on the ground electrode 402.

The ion beams IB are supplied via a first hole 304 made in a side of the arc chamber 302, and a second hole 414 made in the center of the first suppression electrode 404 of the manipulator assembly 400. Next, the ion beams IB are controlled, focused, and discharged via a third hole 416 made in the ground electrode 402 and a fourth hole 418 made in the ground shield 412.

As described previously, in the manipulator assembly of the ion implanter according to the present invention, the distance L1 between the ground electrode 402 and the first suppression electrode 404 and the distance L2 between the ground electrode 402 and the second suppression electrode 406 are kept as in the manipulator assembly according to the prior art. Also, the insulators 410 are installed between the second suppression electrode 406 and the ground electrode 402 to insulate the ground electrode 402 from the first and second suppression electrodes 404 and 406.

Accordingly, the insulators 410 can be longer than the insulators 210 according to the prior art, which resulting in increasing a resistance of the insulators 410. As a result, the period for overhauling the implanter assembly can be increased. In other words, although the ion beams IB are deposited on the insulators 410 due to implantation of impurities into a plurality of pieces of semiconductor wafer using the ion implanter, the period for overhauling the manipulator assembly can be long due to the great resistance of the insulators 410.

Figure 6:
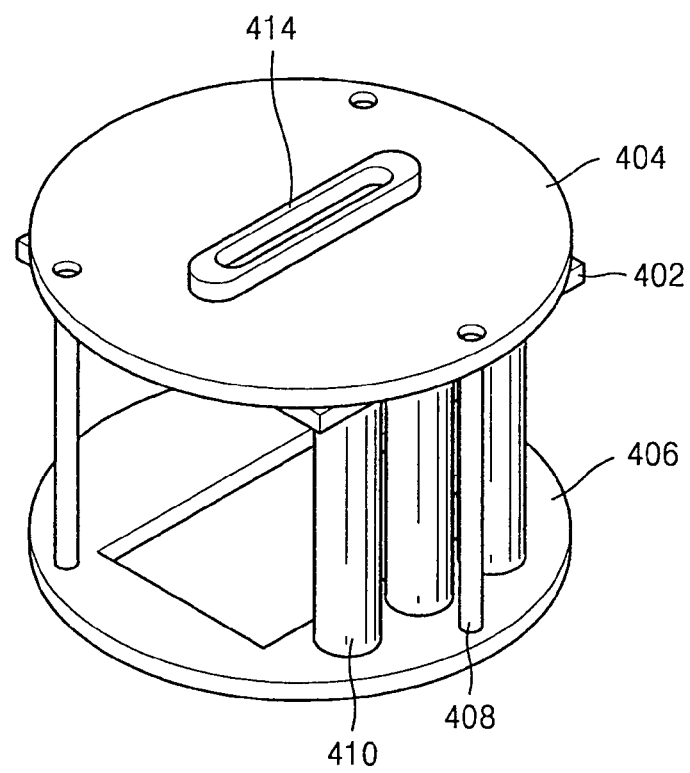
FIGS. 6 and 7 are perspective views of a manipulator assembly, according to different embodiments of the present invention.
Figure 7:
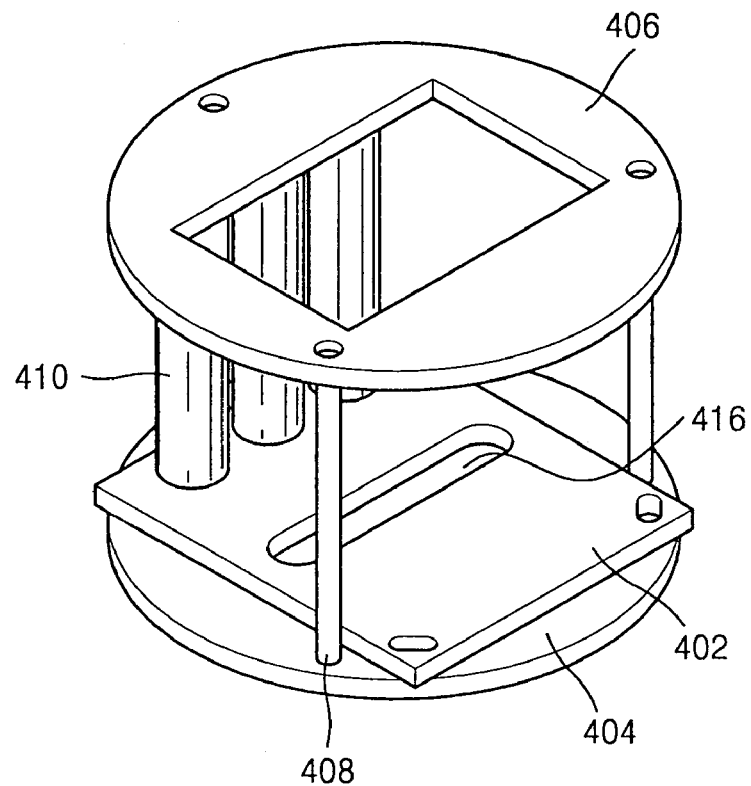

FIGS. 6 and 7 are perspective views of a manipulator assembly, according to different embodiments of the present invention. Reference numerals of FIGS. 6 and 7 denote the same elements as those of FIGS. 4 and 5. For convenience, a ground shield is not shown.

The first suppression electrode 404 is positioned upward in FIG. 6, while the second suppression electrode 406 is positioned upward in FIG. 7. As previously described, the insulators 410 are installed between the first and second suppression electrodes 404 and 406, and the ground electrode 402 to insulate the ground electrode 402 from the first and second suppression electrodes 404 and 406. As shown in FIGS. 6 and 7, three insulators 410 are installed in the form of pillar. However, three insulators may be installed in a different configuration if desired.

Figure 8:
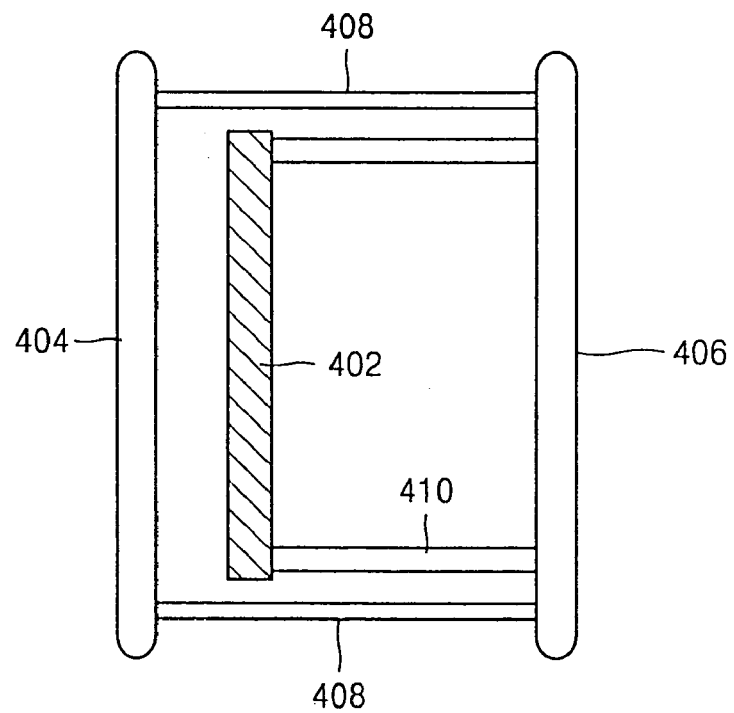
FIG. 8 is a schematic view for explaining the manipulator assembly in the ion implanter according to the present invention.

As shown in FIG. 8, the first and second suppression electrodes 404 and 406 are positioned at the left and right sides of the ground electrode 402. The first and second suppression electrodes 404 and 406 are electrically interconnected via the connection legs 408. As previously described, the insulators 410 are installed between the second suppression electrode 406 and the ground electrode 402 to insulate the ground electrode 402 from the first and second suppression electrodes 404 and 406.

Figure 9:
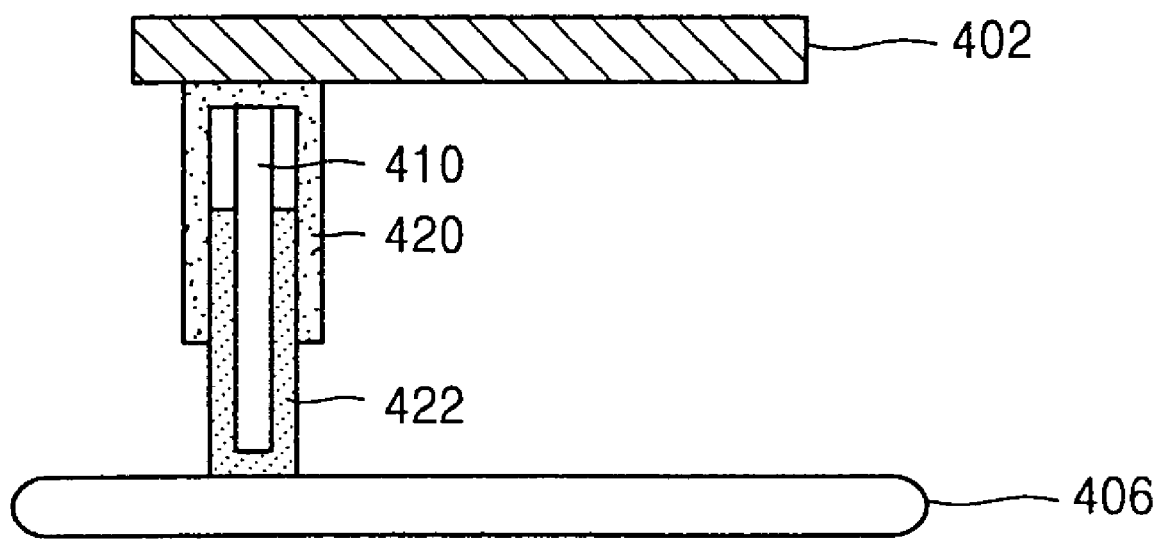
FIG. 9 is a schematic cross-sectional view for explaining the cup shields of the insulators of the manipulator assembly in the ion implanter according to the present invention.

As shown in FIG. 9, first and second cup shields 420 and 422 are installed to prevent ion beams from being deposited around the insulators 410 between the second suppression electrode 406 and the ground electrode 402 during implantation of ions. The first cup shield 420 is installed on the ground electrode 402, and the second cup shield 422 is installed on the second suppression electrode 406. The first and second cup shields 420 and 422 are insulated from each other. The installation of the second cup shield 422 around the insulators 410 can prevent ion beams from being deposited on the insulators 410 so as to prevent a reduction in the resistance of the insulators 410.

As described above, in the manipulator assembly of the ion implanter according to the present invention, distances between the ground electrode 402 and the first and second suppression electrodes 404 and 406 are kept as in the implanter assembly according to the prior art. Also, the insulators 410 are installed between the second suppression electrode 406 and the ground electrode 402 to increase the resistance of the insulators 410. Moreover, the second cup shield 422 is installed around the insulators 410 to prevent ion beams from being deposited on the insulators 410 so as to minimize the reduction in the resistance of the insulators 410.

As a result, the manipulator assembly of the ion implanter according to the present invention can increase the period for overhauling itself by preventing the reduction in the resistance of the insulators 410 which insulate the ground electrode 402 from the first and second suppression electrodes 404 and 406.

As described above, in a manipulator assembly of an ion implanter according to the present invention, insulators can be installed between a second suppression electrode and a ground to increase a resistance of the insulators. Furthermore, a cup shield is installed around the insulators to prevent ion beams from being deposited on the insulators so as to minimize the resistance of the insulators. As a result, an increase in a suppression current can be minimized to thereby increase the period for overhauling the manipulator assembly.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A manipulator assembly in an ion implanter, comprising:
   a ground electrode;
   a first suppression electrode located on a first side of the ground electrode facing an ion source device for producing ion beams;
   a second suppression electrode which is located on a second side of the ground electrode opposite to the first side;
   connection legs for electrically connecting and mechanically supporting the first and second suppression electrodes; and
   an insulator mechanically coupling the ground electrode and the second suppression electrode to insulate the ground electrode from the first and second suppression electrodes.

2. The manipulator assembly in the ion implanter of claim 1, further comprising a ground shield which is installed facing the second suppression electrode so as to prevent the ion beams from being deposited on the ground electrode.

3. The manipulator assembly in the ion implanter of claim 1, wherein the distance between the ground electrode and the second suppression electrode is longer than a distance between the ground electrode and the first suppression electrode.

4. The manipulator assembly in the ion implanter of claim 1, which further includes at least one cup shield for preventing the ion beams from being deposited on the insulator.

5. The manipulator assembly in the ion implanter of claim 4, wherein a first cup shield is installed on the ground electrode.

6. The manipulator assembly in the ion implanter of claim 4, wherein a second cup shield is installed on the second suppression electrode.

7. The manipulator assembly in the ion implanter of claim 4, further comprising a ground shield which is installed facing the second suppression electrode so as to prevent the ion beams from being deposited on the ground electrode.

8. A manipulator assembly in an ion implanter, comprising:
   a ground electrode;
   a first suppression electrode located on a first side of the ground electrode facing an ion source device for producing ion beams;
   a second suppression electrode which is located on a second side of the ground electrode opposite to the first side;
   connection legs for electrically connecting and mechanically supporting the first and second suppression electrodes;
   an insulator mechanically coupling the ground electrode and the second suppression electrode; to insulate the ground electrode from the first and second suppression electrodes; and
   first and second cup shields for preventing the ion beams from being deposited around the insulator.

9. The manipulator assembly in the ion implanter of claim 8, wherein the first cup shield is installed on the ground electrode, and the second cup shield is installed on the second suppression electrode.

10. The manipulator assembly in the ion implanter of claim 8, further comprising a ground shield which is installed facing the second suppression electrode so as to prevent the ion beams from being deposited on the ground electrode.

11. The manipulator assembly in the ion implanter of claim 8, wherein the distance between the ground electrode and the second suppression electrode is longer than a distance between the ground electrode and the first suppression electrode.

12. A manipulator assembly in an in implanter, comprising:
    a ground electrode;
    a first suppression electrode located on a first side of the ground electrode facing an ion source device for producing ion beams;
    a second suppression electrode which is located on a second side of the ground electrode opposite to the first side;
    a ground shield located facing the second suppression electrode so as to prevent the ion beams from being deposited on the ground electrode;
    connection legs for electrically connecting and mechanically supporting the first and second suppression electrodes;
    an insulator mechanically coupling the ground electrode and the second suppression electrode to insulate the ground electrode from the first and second suppression electrodes; and
    first and second cup shields for preventing the ion beams from being deposited around the insulator.

13. The manipulator assembly in the ion implanter of claim 12, wherein the first cup shield is installed on the ground electrode, and the second cup shield is installed on the second suppression electrode.

14. The manipulator assembly in the ion implanter of claim 12, wherein the distance between the ground electrode and the second suppression electrode is longer than a distance between the ground electrode and the first suppression electrode.

15. A manipulator assembly in an ion implanter, comprising:
- a ground electrode comprising a first hole through which ion beams pass;
- a first suppression electrode which is located on a first side of the ground electrode comprising a second hole through which the ion beams pass;
- a second suppression electrode located on a second side of the ground electrode opposite the first side which comprises a third hole through which the ion beams pass;
- connection legs for electrically connecting and mechanically supporting the first and second suppression electrodes;
- an insulator mechanically coupling the ground electrode and the second suppression electrode to insulate the ground electrode from the first and second suppression electrodes; and
- first and second cup shields for preventing the ion beams from being deposited around the insulator.

16. The manipulator assembly in the ion implanter of claim 15, wherein the distance between the ground electrode and the second suppression electrode is longer than a distance between the ground electrode and the first suppression electrode.

17. The manipulator assembly in the ion implanter of claim 15, wherein the first cup shield is installed on the ground electrode, and the second cup shield is installed on the second suppression electrode.

18. The manipulator assembly in the ion implanter of claim 15, further comprising a ground shield which is installed facing the second suppression electrode so as to prevent the ion beams from being deposited on the ground electrode.

19. The manipulator assembly in the ion implanter of claim 1 wherein the insulator is cylindrical or pillar-shaped.

20. The manipulator assembly in the ion implanter of claim 2, wherein the ground shield is attached to the ground electrode.

21. The manipulator assembly in the ion implanter of claim 1, wherein the ground electrode and the ground shield are disposed between the first and the second suppression electrodes.

22. The manipulator assembly in the ion implanter of claim 4, wherein the cup shield is a cylinder having one end closed and the opposite end open.

* * * * *

UNITED STATES PATENT AND TRADEMARK OFFICE
CERTIFICATE OF CORRECTION

PATENT NO. : 7,271,399 B2
APPLICATION NO. : 11/025595
DATED : September 18, 2007
INVENTOR(S) : Sung-Jong Bong et al.

Page 1 of 1

It is certified that error appears in the above-identified patent and that said Letters Patent is hereby corrected as shown below:

Column 6, line 22, the words "electrode; to" should read -- electrode to --;
Column 6, line 42, the words "an in" should read -- an ion --;
Column 8, line 15, the words "claim 1" should read -- claim 1, --.

Signed and Sealed this

Sixteenth Day of September, 2008

JON W. DUDAS
*Director of the United States Patent and Trademark Office*